(12) United States Patent
Chen et al.

(10) Patent No.: US 11,589,454 B2
(45) Date of Patent: Feb. 21, 2023

(54) PRINTED CIRCUIT BOARD AND TERMINAL

(71) Applicant: JRD COMMUNICATION (SHENZHEN) LTD., Shenzhen (CN)

(72) Inventors: Lei Chen, Shenzhen (CN); Liyun Liu, Shenzhen (CN)

(73) Assignee: JRD COMMUNICATION (SHENZHEN) LTD., Shenzhen (CN)

( * ) Notice: Subject to any disclaimer, the term of this patent is extended or adjusted under 35 U.S.C. 154(b) by 351 days.

(21) Appl. No.: 16/905,957

(22) Filed: Jun. 19, 2020

(65) Prior Publication Data

US 2020/0321687 A1 Oct. 8, 2020

Related U.S. Application Data

(63) Continuation of application No. PCT/CN2018/122704, filed on Dec. 21, 2018.

(30) Foreign Application Priority Data

Dec. 21, 2017 (CN) .......................... 201711415578.3

(51) Int. Cl.
*H01Q 1/38* (2006.01)
*H01Q 1/48* (2006.01)
*H01Q 9/04* (2006.01)
*H01Q 9/30* (2006.01)
(Continued)

(52) U.S. Cl.
CPC ......... *H05K 1/0243* (2013.01); *H05K 7/1427* (2013.01); *H05K 2201/10098* (2013.01)

(58) Field of Classification Search
None
See application file for complete search history.

(56) References Cited

U.S. PATENT DOCUMENTS 6,741,212 B2 * 5/2004 Kralovec ............... H01Q 1/241
343/702
7,969,371 B2 * 6/2011 Yun .......................... H01Q 9/36
343/866
(Continued)

FOREIGN PATENT DOCUMENTS

CN 101867384 A 10/2010
CN 101895013 A 11/2010
(Continued)

OTHER PUBLICATIONS

International search report,PCT/CN2018/122704, dated Feb. 27, 2019 (2 pages).
(Continued)

*Primary Examiner* — Tuan A Tran
(74) *Attorney, Agent, or Firm* — PV IP PC; Wei Te Chung; Ude Lu

(57) ABSTRACT

A printed circuit board and a terminal are provided. The printed circuit board includes a feedpoint arrangement region, a ground point arrangement region, and a ground region. The ground region is adjacent to and connected to the ground point arrangement region and is configured to be a ground plate of the antenna. A radiation reduction structure is arranged in the ground region and defines an opening. Therefore, an edge of the printed circuit board is disrupted by the opening.

11 Claims, 3 Drawing Sheets

(51) Int. Cl.
  *H05K 1/02* (2006.01)
  *H05K 7/14* (2006.01)

(56) References Cited

U.S. PATENT DOCUMENTS

| | | | | |
|---|---|---|---|---|
| 8,044,864 | B2 * | 10/2011 | Huchard | H01Q 1/22 |
| | | | | 343/702 |
| 8,669,905 | B2 * | 3/2014 | Hillersborg | H01Q 9/0457 |
| | | | | 343/702 |
| 8,723,732 | B2 * | 5/2014 | Lee | H01Q 1/2283 |
| | | | | 343/702 |
| 9,608,319 | B2 * | 3/2017 | Tanaka | H01Q 1/38 |
| 2012/0092220 | A1 * | 4/2012 | Tani | H01Q 7/00 |
| | | | | 343/866 |
| 2018/0076500 | A1 * | 3/2018 | Li | H01P 11/003 |

FOREIGN PATENT DOCUMENTS

| | | | | |
|---|---|---|---|---|
| CN | 102683862 | A | 9/2012 | |
| CN | 103414019 | A | 11/2013 | |
| CN | 104681973 | A | 6/2015 | |
| CN | 103956580 | * | 5/2016 | H01Q 9/04 |
| CN | 106571525 | A | 4/2017 | |
| CN | 106992357 | A | 7/2017 | |
| CN | 1 08258414 | A | 7/2018 | |
| JP | 2004343285 | * | 12/2004 | H01Q 1/38 |
| JP | 2004343285 | A | 12/2004 | |
| KR | 20120105681 | * | 9/2012 | H01Q 1/243 |

OTHER PUBLICATIONS

First Office Action from China patent office in a counterpart Chinese patent Application 201711415578.3, dated Jun. 22, 2020 (17 pages).

* cited by examiner

PRINTED CIRCUIT BOARD AND TERMINAL

CROSS-REFERENCE TO RELATED APPLICATIONS

The present application is a continuation-application of International (PCT) Patent Application No. PCT/CN2018/122704 filed on Dec. 21, 2018, which claims foreign priority of Chinese Patent Application No. 201711415578.3, filed on Dec. 21, 2017 in the National Intellectual Property Administration of China, the entire contents of which are hereby incorporated by reference in its entirety.

TECHNICAL FIELD

The present disclosure generally relates to the technical field of antennas, and in particular to a printed circuit board and a terminal.

BACKGROUND

Users may use terminals, such as mobile phones, in daily lives. Radiation may be generated when a terminal is used to make a phone call, transmit data, and connect to an internet. In addition, radiation may also be generated when the terminal is connected to a WiFi. As a frequency of the terminal being connected to the WiFi is increasing, reducing WiFi radiation, i.e., a specific absorption rate (SAR) caused by WiFi connection, may be required for the user's health.

Currently, technologies for reducing the WiFi radiation in the related art may include reducing a conducting power, arranging an increased number of sensors, modifying a structure of an antenna, and the like. Reducing the conducting power and modifying the structure of the antenna may impact radiation performance of the WiFi, and arranging an increased number of sensors may occupy more spaces of the terminal, such that the terminal may not be produced to be thin and light.

SUMMARY OF THE DISCLOSURE

According to a first aspect of the present disclosure, a printed circuit board may be provided and include: a feedpoint arrangement region, configured for an antenna feedpoint to be arranged; a ground point arrangement region, adjacent to the feedpoint arrangement region and configured for an antenna ground point to be arranged; and a ground region, adjacent to and connected to the ground point arrangement region and configured to serve as a ground plate of the antenna. A radiation reduction structure is arranged in the ground region. The radiation reduction structure is configured to cover an entirety of the ground region and comprises a plurality of radiation reduction portions; each radiation reduction portion defines at least one opening. A total length of the radiation reduction structure is greater than or equal to a minimum distance between the antenna ground point and an edge of the printed circuit board, and a width of each radiation reduction portion of the radiation reduction structure is greater than or equal to 0.1 mm.

According to a second aspect of the present disclosure, a printed circuit board may be provided and include: a feedpoint arrangement region, configured for an antenna feedpoint to be arranged; a ground point arrangement region, adjacent to the feedpoint arrangement region and configured for an antenna ground point to be arranged; and a ground region, adjacent to and connected to the ground point arrangement region and configured as a ground plate of the antenna. A radiation reduction structure is arranged in the ground region.

According to a third aspect of the present disclosure, a terminal may be provided and include a shell, a printed circuit board. The shell defines a chamber, and the printed circuit board is received in the chamber and comprises: a feedpoint arrangement region, configured for an antenna feedpoint to be arranged; a ground point arrangement region, adjacent to the feedpoint arrangement region and configured for an antenna ground point to be arranged; and a ground region; adjacent to and connected to the ground point arrangement region and configured as a ground plate of the antenna. A radiation reduction structure is arranged in the ground region.

BRIEF DESCRIPTION OF THE DRAWINGS

To further illustrate technical solutions of embodiments of the present disclosure clearly, drawings for describing the embodiments will be briefly described. Obviously, the following drawings are only some embodiments of the present disclosure. To any one of skill in the art, other drawings may be obtained based on the following drawings without making creative work.

DETAILED DESCRIPTION

Figure 1:
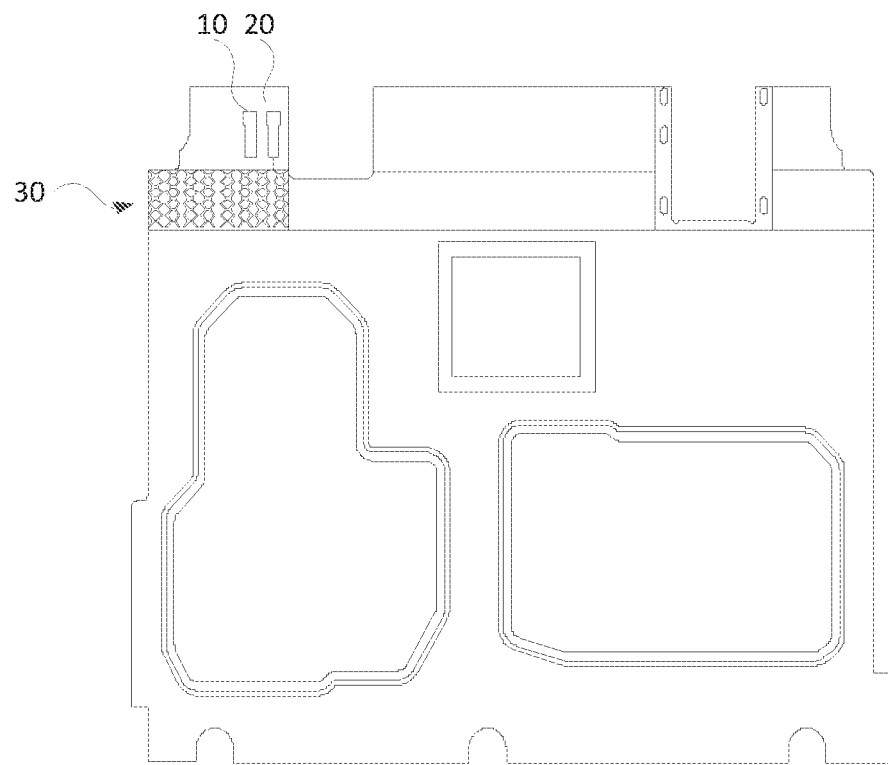
FIG. 1 is a schematic view of a printed circuit board according to an embodiment of the present disclosure.

Technical solutions of the present disclosure will be described clearly and comprehensively by referring to the drawings of the embodiments. Obviously, the embodiments to be described are only a part of, but not all of, the embodiments of the present disclosure. On the basis of the embodiments described in the present disclosure, any one of skill in the art may obtain other embodiments without making creative work, and the other embodiments should be within the scope of the present disclosure.

As shown in FIG. 1, a printed circuit board according to an embodiment of the present disclosure may be provided and may include a feedpoint arrangement region 10, a ground point arrangement region 20, and a ground region 30. The feedpoint arrangement region 10 may be configured for an antenna feedpoint to be arranged. The antenna feedpoint may be connected to a video chip (not shown in the figure) for output. The ground point arrangement region 20 may be adjacent to the feedpoint arrangement region 10 and may be configured for an antenna ground point to be arranged. The ground region 30 may be adjacent to and connected to the ground point arrangement region 20 and may be configured to serve as a ground plate of the antenna.

The antenna ground point may be electrically connected to the ground plate. A radiation reduction structure may be arranged in the ground region 30.

Figure 2:
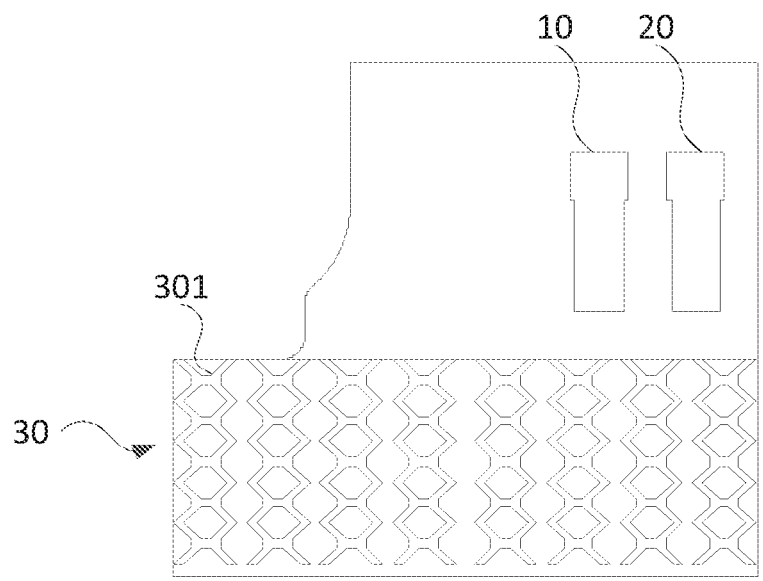
FIG. 2 is a schematic view of a ground region of a printed circuit board according to an embodiment of the present disclosure.
Figure 3:
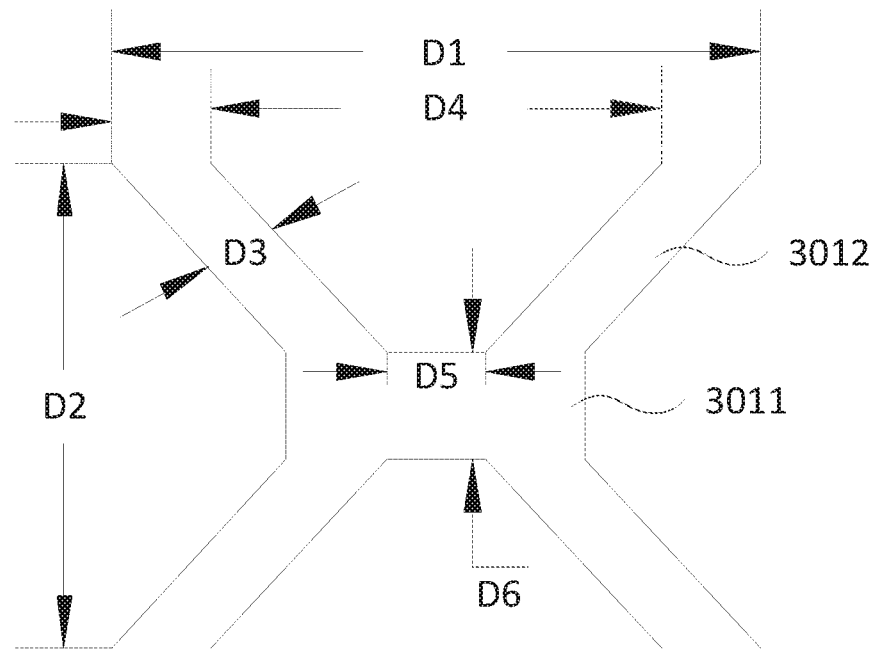
FIG. 3 is a schematic view of a radiation reduction structure of a printed circuit board according to an embodiment of the present disclosure.

Specifically, as shown in FIG. 2 and FIG. 3, the radiation reduction structure 301 maybe a metal layer and include a plurality of radiation reduction portions. The radiation reduction structure may be arranged to cover the entire ground region 30. A total length of the radiation reduction structure 301 may be greater than or equal to a smallest distance between the antenna ground point and an edge of the printed circuit board. A width of each hollow portion of the hollow structure 301 may be greater than or equal to 0.1 mm, such as 0.1 mm, 0.15 mm, or 0.2 mm.

In the present embodiment, the radiation reduction structure 301 may be the plurality of radiation reduction portions arranged in an array, and the array may include 5 rows and 8 columns.

In other embodiments, the array of the plurality of radiation reduction portions may include 8 rows and 8 columns, 6 rows and 4 columns, or the like.

Each radiation reduction portion may define at least one opening, the at least one opening may communicate, and a wall of the at least one opening may be linear. In such a way, the radiation reduction portion may be referred as a linear radiation reduction portion. Each linear radiation reduction portion may occupy an area, a length D1 of the area may be 1 mm to 4 mm, such as 1 mm, 2 mm, or 4 mm, and a width D2 of the area may be 1 mm to 4 mm, such as 1 mm 2 mm, or 4 mm. The at least one opening may include a central opening 3011, defined at a center of the linear radiation reduction portion, and a branched opening 3012, communicating with the central opening 3011 and extending from the center of the linear radiation reduction portion to a corner of the linear radiation reduction. A width D3 of the branched opening 3012 may refer to a minimum distance between two opposing walls of the branched opening 3012 and may be 0.1 mm to 1 mm, such as 0.1 mm, 0.5 mm, or 1 mm. A maximum distance D4 between two adjacent walls of two adjacent branched openings 3012 along a horizontal direction may be 0.2 mm to 1 mm, such as 0.2 mm, 0.5 mm, or 1 mm. A minimum distance D5 between two adjacent walls of two adjacent branched openings 3012 along a horizontal direction may be 0.1 mm to 1 mm, such as 0.1 mm, 0.5 mm, or 1 mm. A width D6 of a lower wall of the central opening 3011 may be 0.1 mm to 1 mm, such as 0.1 mm, 0.5 mm, or 1 mm.

A distance between two adjacent radiation reduction portions along a vertical direction may be 0, such that branched openings of the two adjacent radiation reduction portions along the vertical direction may be communicated, and the edge of the metal layer arranged in the ground region 30 may be interrupted. In such a way, a current may not flow through the edge of the ground region 30 and may be turned and flow through solid regions of the radiation reduction structure 301, a distance between the current of the ground plate and a user may be increased, such that the SAR caused by the WiFi connection may be reduced.

Figure 4:
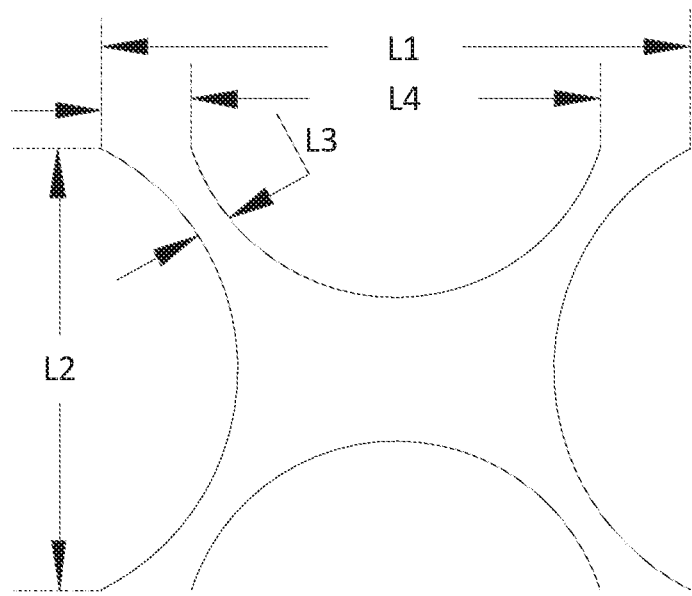
FIG. 4 is a schematic view of a radiation reduction structure of a printed circuit board according to another embodiment of the present disclosure.

As shown in FIG. 4, in other embodiments, the radiation reduction structure 301 may be a plurality of curved radiation reduction portions arranged in an array (the entire array may not be shown in the figure). Each curved radiation reduction portion may define at least one opening communicating with each other, and a wall of the at least one opening may be curved. The curved radiation reduction portion may occupy an area, a length L1 of the area may be 1 mm to 4 mm, such as 1 mm, 2 mm, or 4 mm; and a width L2 of the curved X structure may be 1 mm to 4 mm, such as 1 mm, 2 mm, or 4 mm. A minimum width L3 of two opposing walls of the branched opening of the curved radiation reduction portion may be greater than or equal to 0.1 mm, such as 0.1 mm, 0.15 mm, or 0.2 mm. A maximum distance L4 between two adjacent walls of two adjacent branched openings of the curved radiation reduction portion along a horizontal direction may be 0.2 mm to 1 mm, such as 0.2 mm, 0.5 mm or 1 mm.

As shown in FIGS. 1 to 4, in other embodiments, the radiation reduction structure 301 may include a plurality of linear radiation reduction portions and a plurality of curved radiation reduction portions alternately arranged. For example, a first row may include the linear radiation reduction portions, and a second row may include the curved radiation reduction portions. Alternatively, a top, a bottom, a left, and a right of a single linear radiation reduction portion may be curved radiation reduction portions, and a top, a bottom, a left, and a right of a single curved radiation reduction portion may be linear radiation reduction portions.

Figure 5:
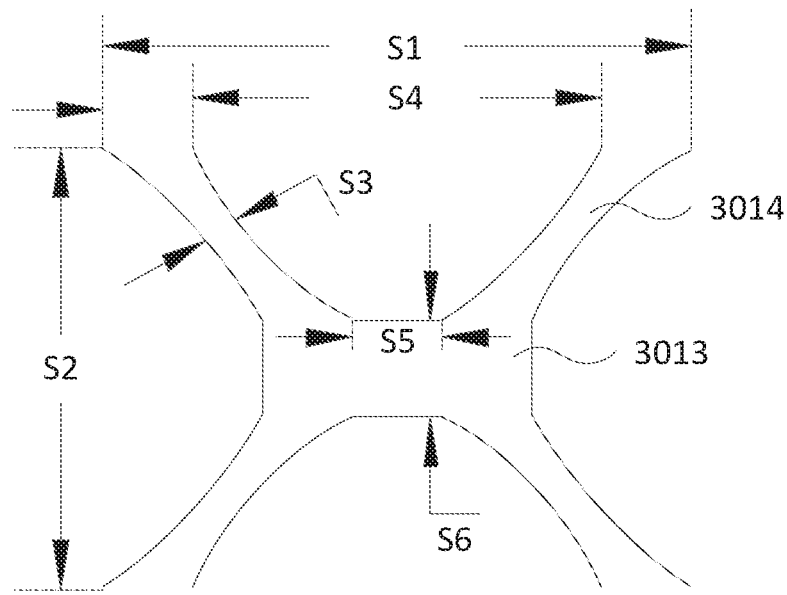
FIG. 5 is a schematic view of a radiation reduction structure of a printed circuit board according to another embodiment of the present disclosure.

As shown in FIG. 5, in other embodiments, the radiation reduction portion may occupy an area, a length S1 of the area may be 1 mm to 4 mm, such as 1 mm, 2 mm, or 4 mm; and a width S2 of the area may be 1 mm to 4 mm, such as 1 mm, 2 mm, or 4 mm. The radiation reduction portion may define a central opening 3013 at a center of the radiation reduction portion and a branched opening 3014 communicating with the central opening 3013 and extending from the central opening 3013 to a corner of the radiation reduction portion. The central opening 3013 may be linear, and a wall of the branched opening 3014 may be curved. A width S3 of two opposing walls of the branched opening 3014 may be 0.1 mm to 1 mm, such as 0.1 mm, 0.5 mm, or limn. A maximum distance S4 between two adjacent walls of two adjacent branched openings 3014 along a horizontal direction may be 0.2 mm to 1 mm, such as 0.2 mm, 0.5 mm or 1 mm. A minimum distance S5 between two adjacent walls of two adjacent branched openings along the horizontal direction may be 0.1 mm to 1 mm, such as 0.1 mm, 0.5 mm or 1 mm. A width S6 of a lower wall of the central opening 3014 along the horizontal direction may be 0.1 mm to 1 mm, such as 0.1 mm, 0.5 mm or 1 mm.

In other embodiments, the radiation reduction structure may include a curved central opening, i.e., the wall of the central opening being curved, and a linear branched opening. A radiation reduction portion having the curved central opening and the linear branched opening and a radiation reduction portion having the linear central opening and the curved branched opening may be referred as a mixed radiation reduction portion.

As shown in FIGS. 1 to 5, in other embodiments, the radiation reduction structure 301 may include a plurality of linear radiation reduction portions, a plurality of curved radiation reduction portions, and a plurality of mixed radiation reduction portions. For example, the first row may include the linear radiation reduction portions, the second row may include the curved radiation reduction portions, and a third row may include the mixed radiation reduction portions. Alternatively, a top, a bottom, a left, and a right of a single linear radiation reduction portion may be curved radiation reduction portions and/or mixed radiation reduction portions; a top, a bottom, a left, and a right of a single curve radiation reduction portion may be linear radiation reduction portions and/or mixed radiation reduction portions; and a top, a bottom, a left, and a right of a single mixed radiation reduction portion may be linear radiation reduction portions and/or curved radiation reduction portions.

According to the present embodiment, the radiation reduction structure may be arranged in the ground region of the printed circuit board, a route for the current flow in the ground region may be extended, such that an inductance between the ground region and the antenna may be increased, the parasitic capacitance between the ground region and the antenna may be reduced, and the resonant frequency of the antenna may be reduced. In such a way, the SAR caused by WiFi connection may be reduced, and at the same time, the radiation performance of the antenna remains.

Figure 6:
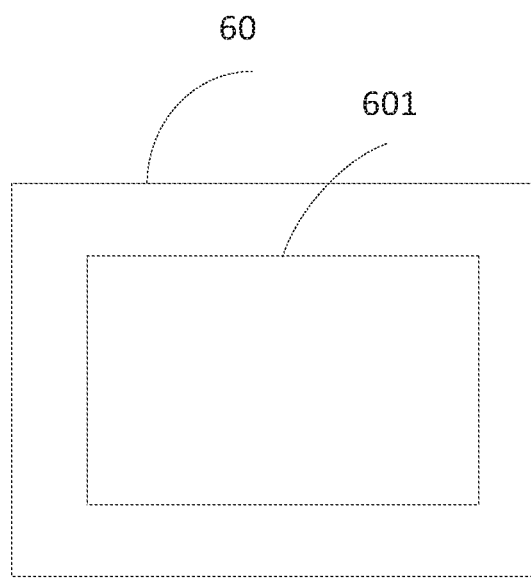
FIG. 6 is a schematic view of a terminal according to an embodiment of the present disclosure.

As shown in FIG. 6, a terminal 60 may be provided and include a shell 602 and a printed circuited board 601. The shell 602 may define a chamber, and the printed circuit board 601 may be received in the chamber. Specifically, a structure of the printed circuit board may refer to the above embodiments, which will not be repeatedly described hereinafter.

According to the present embodiment, the radiation reduction structure may be arranged in the ground region of the printed circuit board, the route for the current flow in the ground region may be extended, such that an inductance between the ground region and the antenna may be increased, the parasitic capacitance between the ground region and the antenna may be reduced, and the resonant frequency of the antenna may be reduced. In such a way, the SAR caused by WiFi connection may be reduced, and at the same time, the radiation performance of the antenna remains.

The above description only shows implementations of the present disclosure, but does not limit the scope of the present disclosure. Any equivalent structural or process transformation performed based on the specification and drawings of the present disclosure, applied directly or indirectly in other related arts, should also be included in the scope of the present disclosure.

What is claimed is:

1. A printed circuit board, comprising:
a feedpoint arrangement region, configured for an antenna feedpoint to be arranged;
a ground point arrangement region, adjacent to the feedpoint arrangement region and configured for an antenna ground point to be arranged; and
a ground region, adjacent to and connected to the ground point arrangement region and configured to serve as a ground plate of the antenna;
wherein a radiation reduction structure is arranged in the ground region;
the radiation reduction structure is configured to cover an entirety of the ground region and comprises a plurality of radiation reduction portions; each radiation reduction portion defines at least one opening, a total length of the radiation reduction structure is greater than or equal to a minimum distance between the antenna ground point and an edge of the printed circuit board, and a width of each radiation reduction portion of the radiation reduction structure is greater than or equal to 0.1 mm;
the at least one opening of the radiation reduction portion comprises a central opening defined at a center of the radiation reduction portion and a branched opening communicating with the central opening and extending from the central opening to a corner of the radiation reduction portion; and
the plurality of radiation reduction portions are a plurality of linear radiation reduction portions when a wall of the at least one opening is linear.

2. The printed circuit board according to claim 1, wherein the plurality of linear radiation reduction portions are arranged in an array, and the array comprises 5 rows and 8 columns.

3. The printed circuit board according to claim 1, wherein each linear radiation reduction portion occupies an area, a length of the area is 1 mm to 4 mm, and a width of the area is 1 mm to 4 mm.

4. The printed circuit board according to claim 1, wherein a width of two opposing walls of the branched opening is 0.1 mm to 1 mm, a maximum length between two adjacent walls of two adjacent branched openings along a length direction of the radiation reduction portion is 0.2 mm to 1 mm, a minimum length between two adjacent walls of two adjacent branched openings along the length direction of the radiation reduction portion is 0.1 mm to 1 mm, and a length of the wall of the central opening is 0.1 mm to 1 mm.

5. A printed circuit board, comprising:
a feedpoint arrangement region, configured for an antenna feedpoint to be arranged;
a ground point arrangement region, adjacent to the feedpoint arrangement region and configured for an antenna ground point to be arranged; and
a ground region, adjacent to and connected to the ground point arrangement region and configured as a ground plate of the antenna;
wherein a radiation reduction structure is arranged in the ground region;
the radiation reduction structure is arranged to cover an entirety of the ground region and defines openings, such that an edge of the printed circuit board in interrupted;
the radiation reduction structure comprises a plurality of linear radiation reduction portions;
each linear radiation reduction portion defines at least one opening, the at least one opening comprises a central opening defined at a center of the linear radiation reduction portion and a branched opening communicating with the central opening and extending from the center of the linear radiation reduction portion to a corner of the radiation reduction portion; and
a wall of the at least one opening is linear.

6. The printed circuit board according to claim 5, wherein a total length of the radiation reduction structure is greater than or equal to a minimum distance between the antenna ground point and the edge of the printed circuit board.

7. The printed circuit board according to claim 5, wherein the radiation reduction structure comprises a plurality of radiation reduction portion, a width of each radiation reduction portion is greater than or equal to 0.1 mm.

8. The printed circuit board according to claim 5, wherein the plurality of linear radiation reduction portions are arranged in an array, and the array comprises 5 rows and 8 columns.

9. The printed circuit board according to claim 5, wherein each linear radiation reduction portion occupies an area, a length of the area is 1 mm to 4 mm, and a width of the area is 1 mm to 4 mm.

10. The printed circuit board according to claim 5, wherein
a distance between two opposing walls of the branched opening is 0.1 mm to 1 mm, a maximum distance between two adjacent walls of two adjacent branched openings along a length direction of the radiation reduction portion is 0.2 mm to 1 mm, a minimum distance between two adjacent walls of two adjacent branched openings along a length direction of the radiation reduction portion is 0.1 mm to 1 mm, and a length of the wall of the central opening along the length direction is 0.1 mm to 1 mm.

11. A terminal, comprising a shell and a printed circuit board, the shell defining a chamber and the printed circuit board being received in the chamber and comprising:
   a feedpoint arrangement region, configured for an antenna feedpoint to be arranged;
   a ground point arrangement region, adjacent to the feedpoint arrangement region and configured for an antenna ground point to be arranged; and
   a ground region, adjacent to and connected to the ground point arrangement region and configured as a ground plate of the antenna;
   wherein a radiation reduction structure is arranged in the ground region;
   the radiation reduction structure is arranged to cover an entirety of the ground region and defines an opening, such that an edge of the printed circuit board is interrupted by the opening;
   a total length of the radiation reduction structure is greater than or equal to a minimum distance between the antenna ground point and the edge of the printed circuit board;
   the radiation reduction structure comprises a plurality of linear radiation reduction portions, a width of each radiation reduction portion is greater than or equal to 0.1 mm, and a wall of the opening of the radiation reduction structure is linear; and
   the plurality of linear radiation reduction portions are arranged in an array, the array comprises 5 rows and 8 columns;
   each linear radiation reduction portion occupies an area, a length D1 of the area is 1 mm to 4 mm, a width D2 of the area is 1 mm to 4 mm; and
   the linear radiation reduction portion defines at least one opening, the at least one opening comprises a central opening at a center of the linear radiation reduction portion and a branched opening communicating with the central opening and extending from the center of the linear radiation reduction portion to a corner of the linear radiation reduction portion, a distance between two opposing walls of the branched opening is 0.1 mm to 1 mm, a maximum length between two adjacent walls of two adjacent opening along a length direction of the linear radiation reduction portion is 0.2 mm to 1 mm, a minimum length between two adjacent walls of two adjacent opening along a length direction of the linear radiation reduction portion is 0.1 mm to 1 mm, and a length of the wall of the central opening along the length direction is 0.1 mm to 1 mm.

\* \* \* \* \*